(12) United States Patent
Yukawa et al.

(10) Patent No.: US 8,841,027 B2
(45) Date of Patent: Sep. 23, 2014

(54) POWER STORAGE DEVICE

(75) Inventors: Mikio Yukawa, Kanagawa (JP); Tamae Moriwaka, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 597 days.

(21) Appl. No.: 13/049,407

(22) Filed: Mar. 16, 2011

(65) Prior Publication Data

US 2011/0236757 A1    Sep. 29, 2011

(30) Foreign Application Priority Data

Mar. 26, 2010    (JP) ................. 2010-072750

(51) Int. Cl.
*H01M 4/58*    (2010.01)
*H01M 4/26*    (2006.01)
*C23C 14/34*    (2006.01)
*C23C 14/06*    (2006.01)

(52) U.S. Cl.
USPC .............. 429/221; 429/218.1; 429/231.95; 29/623.1; 29/623.5; 204/192.1

(58) Field of Classification Search
USPC ............. 429/128, 209, 218.1, 221, 231.9, 429/231.95; 29/623.1; 204/192.1
See application file for complete search history.

(56) References Cited

U.S. PATENT DOCUMENTS

| 5,910,382 | A | 6/1999 | Goodenough et al. |
| 6,391,493 | B1 | 5/2002 | Goodenough et al. |
| 6,514,640 | B1 | 2/2003 | Armand et al. |
| 2006/0194113 | A1 | 8/2006 | Okada et al. |
| 2010/0112446 | A1 | 5/2010 | Okada et al. |

FOREIGN PATENT DOCUMENTS

| CN | 001875506 A | 12/2006 | |
| EP | 1 684 370 A1 | 7/2006 | |
| JP | 2000-509193 | 7/2000 | |
| JP | 2004-111068 | 4/2004 | |
| JP | 2004111068 A | * 4/2004 | ............. H01M 4/58 |
| JP | 2005-108681 | 4/2005 | |
| JP | 2005-158673 | 6/2005 | |
| JP | 2006-190528 | 7/2006 | |
| JP | 2008-034306 | 2/2008 | |
| JP | 2008-257894 | 10/2008 | |
| JP | 2008-262844 | 10/2008 | |
| WO | WO 2005/043654 A1 | 5/2005 | |
| WO | WO 2008/125984 A1 | 10/2008 | |

OTHER PUBLICATIONS

International Search Report (Application No. PCT/JP2011/054210; PCT13359) dated Jun. 7, 2011.
Written Opinion (Application No. PCT/JP2011/054210; PCT13359) dated Jun. 7, 2011.

* cited by examiner

*Primary Examiner* — Carlos Barcena
(74) *Attorney, Agent, or Firm* — Nixon Peabody LLP; Jeffrey L. Costellia

(57) ABSTRACT

A power storage device with favorable battery characteristics and a manufacturing method thereof are provided. The power storage device includes at least a positive electrode and a negative electrode provided so as to face the positive electrode with an electrolyte provided therebetween. The positive electrode includes a collector and a film containing an active material over the collector. The film containing the active material contains $Li_eFe_fP_gO_h$ satisfying relations $3.5 \leq h/g \leq 4.5$, $0.6 \leq g/f \leq 1.1$, and $0 \leq e/f \leq 1.3$ and $Li_aFe_bP_cO_d$ satisfying relations $3.5 \leq d/c \leq 4.5$, $0.6 \leq c/b \leq 1.8$, and $0.7 \leq a/b \leq 2.8$. The film containing the active material contains the $Li_aFe_bP_cO_d$ satisfying the relations $3.5 \leq d/c \leq 4.5$, $0.6 \leq c/b \leq 1.8$, and $0.7 \leq a/b \leq 2.8$ in a region which is in contact with the electrolyte.

18 Claims, 2 Drawing Sheets

POWER STORAGE DEVICE

TECHNICAL FIELD

The present invention relates to a power storage device and a manufacturing method thereof.

BACKGROUND ART

In recent years, the development of power storage devices such as a lithium ion secondary battery and a lithium ion capacitor has been conducted. Of secondary batteries, a lithium ion battery formed using a metal oxide containing lithium, such as lithium iron phosphate has high capacitance and high safety.

As typical structure examples of lithium iron phosphate that is used for a positive electrode of a secondary battery, there are $LiFePO_4$ of an olivine structure that contains a divalent iron ion (hereinafter referred to as Fe(II)) and $Li_3Fe_2(PO_4)_3$ of a Na Super Ionic Conductor (NASICON) structure that contains a trivalent iron ion (hereinafter referred to as Fe(III)). $LiFePO_4$ of an olivine structure that contains Fe(II) is an excellent positive electrode material which has high capacitance and a high discharge potential (see Patent Document 1).

In a battery in which lithium iron phosphate is used as an active material of a positive electrode, a redox reaction occurs in iron due to insertion and extraction of a lithium ion. For example, it is known that in $LiFePO_4$ having an olivine structure, a redox reaction between Fe(II) and Fe(III) occurs due to insertion and extraction of a lithium ion. In a similar way, in lithium iron phosphate containing Fe(III), such as $Li_3Fe_2(PO_4)_3$ having a NASICON structure, redox reaction between Fe(III) and Fe(II) occurs (see Patent Document 2).

A thin-film battery whose electrode is formed by a technique for forming a thin film (e.g., a sputtering method) has characteristics such as excellent flexibility and high durability and has attracted attention in recent years. In many cases, lithium iron phosphate formed by a sputtering method has an amorphous structure. Moreover, when subjected to heat treatment, lithium iron phosphate having an amorphous structure can be changed into lithium iron phosphate having a crystalline structure, such as $LiFePO_4$ having an olivine structure or $Li_3Fe_2(PO_4)_3$ having a NASICON structure. Lithium iron phosphate having an amorphous structure and lithium iron phosphate having a crystalline structure can be used as an active material of a positive electrode.

REFERENCE

Patent Document

[Patent Document 1] Japanese Published Patent Application No. 2008-257894
[Patent Document 2] Japanese Translation of PCT International Application No. 2000-509193

DISCLOSURE OF INVENTION

However, in $LiFePO_4$ of an olivine structure that contains Fe(II), Fe(II) is readily oxidized to Fe(III) by oxygen in an atmosphere. For example, in a step of performing heat treatment on lithium iron phosphate having an amorphous structure which is formed by a technique for forming a thin film, residual oxygen in a heat treatment atmosphere oxidizes Fe(II) and the lithium iron phosphate having an amorphous structure is changed into $Li_3Fe_2(PO_4)_3$ having a NASICON structure that contains Fe(III), which is problematic. In addition, even in lithium iron phosphate having an amorphous structure on which no heat treatment is performed, natural oxidation by oxygen in the air occurs, so that $Li_3Fe_2(PO_4)_3$ having a NASICON structure that contains Fe(III) is formed on a surface. It is relatively difficult to control the natural oxidation, which makes it difficult to control a thickness of lithium iron phosphate having a NASICON structure and reduces its reliability as an active material of a positive electrode.

On the other hand, in the case where reduction from Fe(III) to Fe(II) occurs in lithium iron phosphate having a NASICON structure that contains Fe(III), Li ions need to be inserted into the lithium iron phosphate containing Fe(III). Therefore, when lithium iron phosphate having a NASICON structure that contains Fe(III) is used as an active material of a positive electrode, a material containing Li needs to be used for a negative electrode.

However, in the case of using graphite, which is generally used as a negative electrode material in lithium ion batteries, the graphite needs to be doped with Li in advance, which makes a process complicated. Lithium titanate ($Li_4Ti_5O_{12}$) can be given as an example of a negative electrode material containing lithium but has a higher reduction potential than graphite and a cell potential is made lower. Moreover, when a negative electrode is formed using lithium metal, a precipitate is generated and a positive electrode and the negative electrode are short-circuited, which is problematic. From the above reasons, when a negative electrode is formed using a material containing lithium, it is difficult to manufacture a simple power storage device having high reliability and a high cell potential.

An object of one embodiment of the present invention is to provide a power storage device with favorable battery characteristics and a manufacturing method of the power storage device.

In view of the above, one embodiment of the present invention is a power storage device including at least a positive electrode and a negative electrode which is provided so as to face the positive electrode with an electrolyte provided therebetween. The positive electrode includes a collector and a film containing an active material which is provided over the collector. The film containing the active material contains $Li_eFe_fP_gO_h$ satisfying relations $3.5 \le h/g \le 4.5$, $0.6 \le g/f \le 1.1$, and $0 \le e/f \le 1.3$ and $Li_aFe_bP_cO_d$ satisfying relations $3.5 \le d/c \le 4.5$, $0.6 \le c/b \le 1.8$, and $0.7 \le a/b \le 2.8$. The film containing the active material contains the $Li_aFe_bP_cO_d$ satisfying the relations $3.5 \le d/c \le 4.5$, $0.6 \le c/b \le 1.8$, and $0.7 \le a/b \le 2.8$ in a region which is in contact with the electrolyte.

The negative electrode may contain a material which does not include lithium.

In the film containing the active material, after formation of the electrode and before operation of a battery, lithium iron phosphate containing Fe(II) is formed on a surface which is in contact with the collector and lithium iron phosphate containing Fe(III) is formed on a surface which is in contact with the electrolyte.

A typical example of lithium iron phosphate containing Fe(II) is $LiFePO_4$. A typical example of lithium iron phosphate containing Fe(III) is $Li_3Fe_2(PO_4)_3$. Each of the lithium iron phosphate containing Fe(II) and the lithium iron phosphate containing Fe(III) may have an amorphous structure. Alternatively, when the lithium iron phosphate containing Fe(II) has a crystalline structure, the lithium iron phosphate containing Fe(II) may be $LiFePO_4$ having an olivine structure. Further, when the lithium iron phosphate containing Fe(III) has a crystalline structure, the lithium iron phosphate containing Fe(III) may be $Li_3Fe_2(PO_4)_3$ having a NASICON structure.

The active material of the positive electrode which has the above structure may be formed to have a stacked-layer structure including two or more layers. In that case, for example, the positive electrode has a stacked-layer structure including the collector, a film containing an active material (A) formed over the collector, and a film containing an active material (B) formed over the film containing the active material (A). After the formation of the electrode and before the operation of the battery, the active material (A) contains lithium iron phosphate containing Fe(II) and the active material (B) is lithium iron phosphate containing (III). In the positive electrode, the film containing the active material (B) is positioned on a surface which is in contact with the electrolyte. Thus, the film containing the active material (B) is positioned between the film containing the active material (A) and the electrolyte. Note that another structure is acceptable as long as the active material (A) contains at least lithium iron phosphate containing Fe(II). For example, the active material (A) may contain lithium iron phosphate containing Fe(II) and lithium iron phosphate containing Fe(III).

In the above structure, the lithium iron phosphate containing Fe(II) which is contained in the active material (A) is the $Li_eFe_fP_gO_h$ satisfying the relations $3.5 \leq h/g \leq 4.5$, $0.6 \leq g/f \leq 1.1$, and $0 \leq e/f \leq 1.3$. The lithium iron phosphate containing Fe(III) which is the active material (B) is the $Li_aFe_bP_cO_d$ satisfying the relations $3.5 \leq d/c \leq 4.5$, $0.6 \leq c/b \leq 1.8$, and $0.7 \leq a/b \leq 2.8$.

In the above structure, each of the film containing the active material (A) and the film containing the active material (B) may have an amorphous structure. Alternatively, when the active material (A) has a crystalline structure, the active material (A) may be $LiFePO_4$ having an olivine structure. Further, when the active material (B) has a crystalline structure, the active material (B) may be $Li_3Fe_2(PO_4)_3$ having a NASICON structure.

One embodiment of the present invention is a method for manufacturing a power storage device including a positive electrode and a negative electrode which is provided so as to face the positive electrode with an electrolyte provided therebetween. The positive electrode is formed by forming a film containing an active material (A) over a collector and then forming a film containing an active material (B) over the film containing the active material (A). The active material (A) contains lithium iron phosphate containing Fe(II) and the active material (B) is lithium iron phosphate containing Fe(III).

One embodiment of the present invention is a method for manufacturing a power storage device which includes a positive electrode and a negative electrode which is provided so as to face the positive electrode with an electrolyte provided therebetween. The positive electrode is formed by a method including the following steps: a step of forming a film containing an active material (A) over a collector by a sputtering method; and a step of forming a film containing an active material (B) over the film containing the active material (A) by a sputtering method. The two stacked films are formed with the use of the same target. The active material (A) contains lithium iron phosphate containing Fe(II) and the active material (B) is lithium iron phosphate containing Fe(III).

In the above structure, the target used in the sputtering method is a material which contains, as a main component, lithium iron phosphate containing Fe(II). Oxygen partial pressure in a deposition atmosphere at the time of formation of the film containing the active material (A) by a sputtering method is greater than or equal to 0% and less than or equal to 0.01%; oxygen partial pressure in a deposition atmosphere at the time of formation of the film containing the active material (B) is 0.1% or more, preferably 1% or more.

Thus, a power storage device having high reliability and favorable battery characteristics can be manufactured.

BEST MODE FOR CARRYING OUT THE INVENTION

Figure 1:
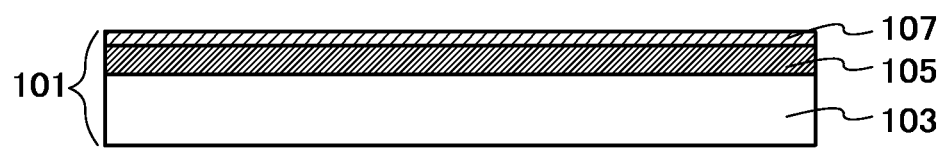
FIG. 1 is a cross-sectional view illustrating a mode of a structure of a power storage device.

Hereinafter, an embodiment will be described in detail with reference to the drawings. Note that, since an embodiment described below can be implemented in many different modes, it is easily understood by those skilled in the art that the mode and the detail can be variously changed without departing from the spirit and the scope of the present invention. Therefore, the present invention is not construed as being limited to the description of the embodiment described below. In the drawings for explaining an embodiment, the same parts or parts having a similar function are denoted by the same reference numerals, and description of such parts is not repeated.

In this embodiment, an example of the structure of a power storage device will be described.

FIG. 1 illustrates an example of a structure of a positive electrode used in a power storage device.

A positive electrode 101 includes a collector 103, a film 105 containing an active material (A) which is formed over the collector 103, and a film 107 containing an active material (B) which is formed over the film 105 containing the active material (A).

As the active material (A), at least lithium iron phosphate containing Fe(II) is used. The active material (B) is lithium iron phosphate containing Fe(III). Note that another structure is acceptable as long as the active material (A) contains at least lithium iron phosphate containing Fe(II). For example, the active material (A) may contain lithium iron phosphate containing Fe(II) and lithium iron phosphate containing Fe(III). In this embodiment, a case where lithium iron phosphate containing Fe(II) is used as the active material (A) is described.

The lithium iron phosphate ($Li_eFe_fP_gO_h$) containing Fe(II) which is contained in the active material (A) satisfies the relations $3.5 \leq h/g \leq 4.5$, $0.6 \leq g/f \leq 1.1$, and $0 \leq e/f \leq 1.3$. The lithium iron phosphate ($Li_aFe_bP_cO_d$) containing Fe(III) which is the active material (B) satisfies the relations $3.5 \leq d/c \leq 4.5$, $0.6 \leq c/b \leq 1.8$, and $0.7 \leq a/b \leq 2.8$.

In this structure, the relations $0.6 \leq g/f \leq 1.1$, $0.6 \leq c/b \leq 1.8$, and $g/f < c/b$ are satisfied. Therefore, the proportion of P to Fe (c/b) in the lithium iron phosphate ($Li_aFe_bP_cO_d$) containing Fe(III) is higher than that in the lithium iron phosphate ($Li_eFe_fP_gO_h$) containing Fe(II).

Further, the relations $0 \leq e/f \leq 1.3$, $0.7 \leq a/b \leq 2.8$, and $e/f < a/b$ are satisfied, and the proportion of Li to Fe (a/b) in the lithium iron phosphate ($Li_aFe_bP_cO_d$) containing Fe(III) is higher than that in the lithium iron phosphate ($Li_eFe_fP_gO_h$) containing Fe(II). From the relation $e/f < a/b$, it is found that the proportion of Li to Fe (a/b) in the lithium iron phosphate ($Li_aFe_bP_cO_d$) containing Fe(III) is higher than that in the lithium iron phosphate ($Li_eFe_fP_gO_h$) containing Fe(II).

A typical example of the lithium iron phosphate ($Li_eFe_fP_gO_h$) containing Fe(II) which is contained in the active material (A) is $LiFePO_4$ (h/g=4, g/f=1, and e/f=1). $LiFePO_4$ having an amorphous structure may be employed. When $LiFePO_4$ having a crystalline structure is employed, the $LiFePO_4$ has an olivine structure. A typical example of the lithium iron phosphate ($Li_aFe_bP_cO_d$) containing Fe(III) is $Li_3Fe_2(PO_4)_3$ (d/c=4, c/b=1.5, and a/b=1.5). $Li_3Fe_2(PO_4)_3$ having an amorphous structure may be employed. When $Li_3Fe_2(PO_4)_3$ having a crystalline structure is employed, the $Li_3Fe_2(PO_4)_3$ has a NASICON structure.

Each of the film 105 containing the active material (A) and the film 107 containing the active material (B) can be a thin film of the active material, a film in which particles of the active material are dispersed, or an aggregate of particles of the active material. The thickness of the film 105 containing the active material (A) is preferably greater than or equal to 50 nm and less than or equal to 30 μm. Further, the thickness of the film 107 containing the active material (B) is preferably greater than or equal to 5 nm and less than or equal to 1 μm. When the thickness of the film 107 containing the active material (B) is half or less the thickness of the film 105 containing the active material (A), a reduction of discharge capacitance can be prevented. Further, in the case where particles of the active material are contained in the film 105 containing the active material (A) and the film 107 containing the active material (B) (i.e., in the case where each of the films 105 and 107 is a film in which the particles of the active material are dispersed or an aggregate of the particles of the active material), the diameter of the particle is preferably greater than or equal to 5 nm and less than or equal to 200 nm.

In this embodiment, the film 105 containing the active material (A) and the film 107 containing the active material (B) are formed by a sputtering method. With the use of a rare gas such as helium, neon, argon, xenon, or krypton as a sputtering gas, a target which contains, as a main component, lithium iron phosphate containing Fe(II) is sputtered, so that the film 105 containing the active material (A) is formed over the collector 103. At this time, oxygen partial pressure in a treatment chamber is greater than or equal to 0% and less than or equal to 0.01%, whereby lithium iron phosphate containing Fe(II) can be formed as the film 105 containing the active material (A).

After that, with the use of a rare gas such as helium, neon, argon, xenon, or krypton with an oxygen partial pressure of 0.1% or more, preferably 1% or more as a sputtering gas, a target which contains, as a main component, lithium iron phosphate containing Fe(II) is sputtered, so that the film 107 containing the active material (B) is formed over the film 105 containing the active material (A). At this time, oxygen partial pressure in the treatment chamber is 0.1% or more, preferably 1% or more, whereby lithium iron phosphate containing Fe(III) can be formed as the film 107 containing the active material (B).

The film 105 containing the active material (A) and the film 107 containing the active material (B) can be sequentially formed in one chamber, which contributes to simplification of the process. Further, when the films are sequentially formed in one chamber, contamination of an interface can be prevented and the film containing the active material can have favorable electrical characteristics. In addition, when the film 107 containing the active material (B) which is stable against oxidation and is not easily oxidized is formed on a surface of the positive electrode, natural oxidation of the lithium iron phosphate containing Fe(II) in the air atmosphere can be suppressed.

Here, as a target, a material which contains lithium iron phosphate containing Fe(II) is used. The target is sputtered with the use of a sputtering gas in which Ar=100%; thus, as the film 105 containing the active material (A), a film of lithium iron phosphate containing Fe(II) which has an amorphous structure is formed to a thickness of 400 nm. Then, the same target is sputtered with the use of a sputtering gas in which Ar=99% and $O_2$=1%; thus, as the film 107 containing the active material (B), a film of lithium iron phosphate containing Fe(III) which has an amorphous structure is formed to a thickness of 40 nm over the film 105 containing the active material (A).

Further, the film 105 containing the active material (A) and the film 107 containing the active material (B) may be subjected to heat treatment so as to have crystalline structures. The lithium iron phosphate containing Fe(III) which is stable against oxidation and is not easily oxidized is formed on a surface of the lithium iron phosphate containing Fe(II) which is an active material of the positive electrode, whereby surface oxidation due to residual oxygen in a heat treatment atmosphere can be prevented and a stable film can be obtained.

Note that as a material of the collector 103, although not particularly limited, a material with high conductivity, such as aluminum or titanium, can be used.

Next, an example of a structure of a power storage device which includes the above-described positive electrode is described.

Figure 2A:
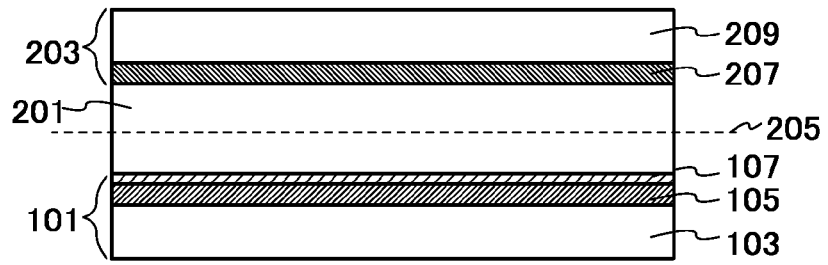
FIGS. 2A to 2C are cross-sectional views illustrating a mode of a structure of a power storage device.
Figure 2B:
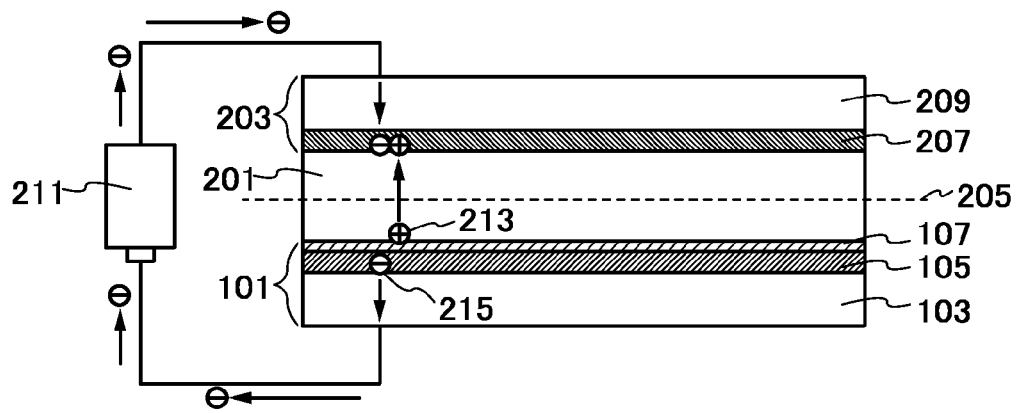
Figure 2C:
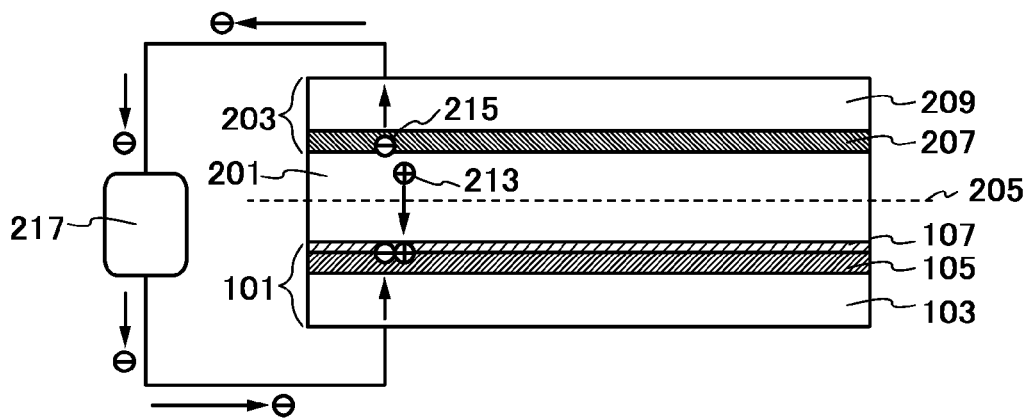

FIGS. 2A to 2C illustrate an example of a structure of a power storage device. The power storage device includes the positive electrode 101 and a negative electrode 203 provided so as to face the positive electrode 101 with an electrolyte 201 provided therebetween. A separator 205 is provided between the positive electrode 101 and the negative electrode 203.

The electrolyte 201 has a function of transporting lithium ions. A material of the electrolyte 201 can be liquid or solid.

When the electrolyte is liquid, the electrolyte includes a solvent and a solute (salt) dissolved in the solvent. As the solvent, for example, a cyclic carbonate such as propylene carbonate or ethylene carbonate, or an acyclic carbonate such as dimethyl carbonate or diethyl carbonate can be used. The solute (salt) can contain one or more kinds of light metal salt (e.g., lithium salt). For example, the solute (salt) can be $LiPF_6$, $LiBF_4$, $Li(CF_3SO_2)_2N$ (LiTFSA), or the like.

When the electrolyte is solid, for example, $Li_3PO_4$; $Li_xPO_yN_z$ (x, y, and z are positive real numbers) which is formed by mixing $Li_3PO_4$ with nitrogen; $Li_2S$—$SiS_2$; $Li_2S$—$P_2S_5$; $Li_2S$—$B_2S_3$; or the like can be used. Alternatively, any of these salts which are doped with LiI can be used.

The separator 205 prevents contact between the positive electrode 101 and the negative electrode 203 and has a function of allowing transport of lithium ions. Examples of a material of the separator 205 include paper, nonwoven fabric, a glass fiber, a polymeric material such as a nylon (a polyamide), vinylon (a poly(vinyl alcohol)-based fiber), a polyolefin such as polypropylene, a polyester, an acrylic resin, or a polyurethane, and the like. Note that a material which does not dissolve in the electrolyte should be selected. Note that when a solid electrolyte is employed as the electrolyte 201, the separator 205 can be omitted.

The negative electrode 203 includes a collector 209 and a film 207 containing an active material.

As a material of the collector 209, although not particularly limited, a material with high conductivity, such as platinum, aluminum, copper, or titanium, can be used. As a material of an active material contained in the film 207, although not particularly limited, a carbon material (e.g., graphite), silicon, or the like can be used. In this embodiment, the film 207 containing the active material, which is included in the negative electrode is formed using graphite.

The positive electrode 101 includes the following components which are illustrated in FIG. 1: the film 105 containing the active material (A) which is formed over the collector 103; and the film 107 containing the active material (B) which is formed over the film 105 containing the active material (A).

Next, an example of charging and discharging when the power storage device is a lithium secondary battery is described.

A power source 211 is connected between the positive electrode 101 and the negative electrode 203 as illustrated in FIG. 2B, whereby charging can be performed. When voltage is applied from the power source 211, a lithium ion in the film 105 containing the active material (A), which is included in the positive electrode 101, is extracted from the film 105, and an electron 215 is generated. The lithium ion 213 is transported to the negative electrode 203 through the electrolyte 201. The electron 215 moves to the negative electrode 203 through the power source 211. Then, the lithium ion 213 receives the electron 215 in the negative electrode 203 and is inserted into the negative electrode 203 as lithium.

When charging is performed, due to extraction of a lithium ion from the positive electrode 101, oxidation from Fe(II) to Fe(III) occurs in the lithium iron phosphate contained in the film 105 containing the active material (A), which is included in the positive electrode. Note that in this embodiment, a lithium ion is not extracted from the film 107 containing the active material (B) when the first charging is performed because in the film 107 containing the active material (B), the active material (B) is the lithium iron phosphate containing Fe(III) and oxidation from Fe(III) to Fe(IV) hardly occurs.

In discharging, a load 217 is connected between the positive electrode 101 and the negative electrode 203 as illustrated in FIG. 2C, whereby discharging can be performed. The lithium inserted into the negative electrode 203 through the charging is ionized, the lithium ion 213 is extracted from the negative electrode 203, and the electron 215 is generated. The lithium ion 213 is transported to the positive electrode 101 through the electrolyte 201. The electron 215 moves to the positive electrode 101 through the load 217. Then, the lithium ion 213 is transported through the layer 107 containing the active material (B) and trapped in the film 105 containing the active material (A). At this time, Fe(III) formed in charging undergoes reduction by receiving the electron 215, resulting in Fe(II).

When discharging is performed, part of lithium ions is trapped in the film 107 containing the active material (B). However, when the film 107 containing the active material (B) is made thinner than the film 105 containing the active material (A), the trap of the lithium ions in the film 107 containing the active material (B) can be suppressed to the minimum.

In the positive electrode 101 which is described in this embodiment, the film 107 containing the active material (B) is formed over the film 105 containing the active material (A). The active material (A) contains lithium iron phosphate containing Fe(II) and the active material (B) is lithium iron phosphate containing Fe(III) which is stable against oxidation; thus, an electrode with stable characteristics can be formed and the battery characteristics of the power storage device are improved.

This application is based on Japanese Patent Application serial No. 2010-072750 filed with Japan Patent Office on Mar. 26, 2010, the entire contents of which are hereby incorporated by reference.

The invention claimed is:

1. A power storage device comprising:
a negative electrode; and
a positive electrode facing the negative electrode with an electrolyte provided therebetween,
wherein the positive electrode comprises a collector and a film containing an active material formed over the collector,
wherein the film is in contact with the electrolyte,
wherein the film has a stacked structure including a first layer and a second layer which comprise a first active material and a second active material, respectively,
wherein the first active material has a composition of $Li_eFe_fP_gO_h$ satisfying relations $3.5 \leq h/g \leq 4.5$, $0.6 \leq g/f \leq 1.1$, and $0 \leq e/f \leq 1.3$, and
wherein the second active material has a composition of $Li_aFe_bP_cO_d$ satisfying relations $3.5 \leq d/c \leq 4.5$, $0.6 \leq c/b \leq 1.8$, and $0.7 \leq a/b \leq 2.8$.

2. The power storage device according to claim 1,
wherein a region of the film, which is in contact with the electrolyte, has a composition of $Li_aFe_bP_cO_d$ satisfying relations $3.5 \leq d/c \leq 4.5$, $0.6 \leq c/b \leq 1.8$, and $0.7 \leq a/b \leq 2.8$.

3. The power storage device according to claim 1,
wherein the first active material has an amorphous structure.

4. The power storage device according to claim 1,
wherein the second active material has an amorphous structure.

5. The power storage device according to claim 1,
wherein the first active material has an olivine structure.

6. The power storage device according to claim 1,
wherein the second active material has a NASICON structure.

7. The power storage device according to claim 1,
wherein the first layer is located between the collector and the second layer.

8. A power storage device comprising:
a negative electrode; and
a positive electrode facing the negative electrode with an electrolyte provided therebetween,
wherein the positive electrode comprises:
a collector;
a first film over the collector, the first film containing a first active material; and
a second film over the first film and in contact with the electrolyte, the second film containing a second active material,
wherein the first active material is lithium iron phosphate containing Fe(II), and
wherein the second active material is lithium iron phosphate containing Fe(III).

9. The power storage device according to claim 8,
wherein the first active material has a composition of $Li_eFe_fP_gO_h$ satisfying relations $3.5 \leq h/g \leq 4.5$, $0.6 \leq g/f \leq 1.1$, and $0 \leq e/f \leq 1.3$.

10. The power storage device according to claim 8,
wherein the second active material has a composition of $Li_aFe_bP_cO_d$ satisfying relations $3.5 \leq d/c \leq 4.5$, $0.6 \leq c/b \leq 1.8$, and $0.7 \leq a/b \leq 2.8$.

11. The power storage device according to claim 8,
wherein the first active material has a composition of $Li_eFe_fP_gO_h$ satisfying relations $3.5 \leq h/g \leq 4.5$, $0.6 \leq g/f \leq 1.1$, and $0 \leq e/f \leq 1.3$, and
wherein the second active material has a composition of $Li_aFe_bP_cO_d$ satisfying relations $3.5 \leq d/c \leq 4.5$, $0.6 \leq c/b \leq 1.8$, and $0.7 \leq a/b \leq 2.8$.

12. The power storage device according to claim 11, wherein a relation g/f<c/b is satisfied.

13. The power storage device according to claim 11, wherein a relation e/f<a/b is satisfied.

14. The power storage device according to claim 8, wherein the first active material has an amorphous structure.

15. The power storage device according to claim 8, wherein the second active material has an amorphous structure.

16. The power storage device according to claim 8, wherein the first active material has an olivine structure.

17. The power storage device according to claim 8, wherein the second active material has a NASICON structure.

18. The power storage device according to claim 8, wherein a thickness of the first film is larger than a thickness of the second film.

* * * * *